United States Patent [19]
Ochiai

[11] Patent Number: 5,589,419
[45] Date of Patent: Dec. 31, 1996

[54] PROCESS FOR FABRICATING SEMICONDUCTOR DEVICE HAVING A MULTILEVEL INTERCONNECTION

[75] Inventor: Akihiko Ochiai, Kanagawa, Japan

[73] Assignee: Sony Corporation, Japan

[21] Appl. No.: 505,786

[22] Filed: Jul. 21, 1995

[30] Foreign Application Priority Data

Jul. 26, 1994 [JP] Japan .................................. 6-194873

[51] Int. Cl.⁶ .................................................. H01L 21/283
[52] U.S. Cl. .............................. 437/795; 437/59; 437/67; 437/974; 748/DIG. 135; 748/DIG. 12
[58] Field of Search .......................... 437/67, 195, 974, 437/40, 41, 228, 59; 748/DIG. 12, DIG. 135; 257/758, 760

[56] References Cited

U.S. PATENT DOCUMENTS

| | | | |
|---|---|---|---|
| 5,091,330 | 2/1992 | Cambou et al. | 437/62 |
| 5,168,078 | 12/1992 | Reisman et al. | 437/195 |
| 5,437,762 | 8/1995 | Ochiai et al. | 216/20 |
| 5,496,764 | 3/1996 | Sun | 437/67 |

FOREIGN PATENT DOCUMENTS 1-50543  2/1989  Japan .............................. 148/DIG. 12

*Primary Examiner*—T. N. Quach
*Attorney, Agent, or Firm*—Ronald P. Kananen

[57] ABSTRACT

A process for fabricating a semiconductor device comprising multilevel interconnection, comprising: forming a trench on the surface of a first substrate to provide an element isolating region; forming a first insulating film on the surface of the trench and the first substrate; forming a first interconnection layer on the surface of the first insulating film; forming a second insulating film on the surface of the first substrate in such a manner that the first interconnection layer is covered and the trench is filled; forming a second interconnection layer on the second insulating film; forming sequentially in this order, a third insulating film and an adhesion layer on the surface of said second insulating film covering the second interconnection layer; bonding a second substrate on the surface of the adhesion layer; planarizing the back of the first substrate by removing the first substrate from the back side thereof and the bottom of the trench; and forming a fourth insulating film on the back of the first substrate, and forming a third interconnection layer on the fourth insulating film. The process according to the present invention enables a semiconductor device comprising a multilevel interconnection with small step height.

6 Claims, 5 Drawing Sheets

PROCESS FOR FABRICATING SEMICONDUCTOR DEVICE HAVING A MULTILEVEL INTERCONNECTION

BACKGROUND OF THE INVENTION

The present invention relates to a process for fabricating a semiconductor device having a multilevel interconnection.

With increasing demand for LSIs having a higher degree of integration, more multilevel interconnections are brought to use. Accordingly, the steps for fabricating interconnections are accounting for a larger part in the entire process for fabricating a semiconductor device. In a process for fabricating a 0.35-μm ASIC (Application Specific IC) device, for instance, it is said that the process for fabricating the interconnection account for about one-third of the entire fabricating process.

Known processes for fabricating an interconnection heretofore comprise alternately stacking an interconnection layer and an insulating film on a substrate.

More specifically, referring to FIG. 7, a first interconnection 52 is formed on the surface of a substrate 50 with a first insulating film interposed therebetween. Then, a second interconnection 54 is formed on the first interconnection 52 with a second insulating film 53 interposed therebetween. Similarly, a third insulating film 56, a third interconnection 57, a fourth insulating film 58, and a fourth interconnection 59 are formed sequentially in this order to form a multilevel interconnection.

The multilevel interconnection described hereinbefore greatly contributes to the implementation of more compact chips having a yet improved performance.

However, in cases of forming a multilevel interconnection in accordance with a related art process described above, step height of the interconnections increases with the increasing number of interconnection layers. This makes the processing of the interconnection more difficult as the process proceeds to the steps related to the upper layers, and causes problems such as contact failure or short circuit and/or open circuit failure of the interconnections.

Referring to FIG. 7, for example, in the case where a contact hole 55 is provided to the first insulating film 51 and the second insulating film 53, the step height of the second interconnection becomes extremely large at the portion of the contact hole. It can be see that such a large step height disables the formation of a good contact between the second interconnection 54 and the third interconnection 56 formed in the upper portion of the second interconnection.

Such a contact failure or short circuit and/or open circuit failure of the interconnections lowers the product yield of semiconductor devices.

SUMMARY OF THE INVENTION

An object of the present invention is to overcome the aforementioned problems, and to provide a process for fabricating a semiconductor device which comprises a multilevel interconnection having small step height among the interconnections.

The aforementioned object of the process according to the present invention can be accomplished in various ways.

According to an aspect of the present invention, the present invention provides a process for fabricating a semiconductor device having a multilevel interconnection, comprising: a first step of forming a trench on the surface of a first substrate in such a manner that the trench may surround a region in which the elements are formed, thereby providing an element isolating region, followed by a formation of a first insulating film on the surface of the trench and the first substrate; a second step of forming a first interconnection layer on the surface of the first insulating film; a third step of forming a second insulating film on the surface of the first substrate in such a manner that the first interconnection layer is covered and the trench is filled, followed by a formation of a second interconnection layer on the second insulating film; a fourth step of forming sequentially in this order, a third insulating film and an adhesion layer on the surface of said second insulating film in such a manner that the second interconnection layer is covered thereby, followed by a bonding of a second substrate on the surface of the adhesion layer and a removal of the first substrate starting from the back side of the first substrate until the bottom of the trench is reached; and a fifth step of planarizing the back of the first substrate by forming a fourth insulating film on the back of the first substrate, and forming a third interconnection layer on the fourth insulating film.

According to another aspect of the present invention, there is provided a process for fabricating a semiconductor device as described above, wherein the first step of forming a first insulating film comprises forming a gate insulating film, and the second step for forming a first interconnection layer comprises forming a gate electrode by patterning a conductive film.

That is, a process according to the present invention comprises forming a first interconnection and a second interconnection on a first substrate, and then bonding an adhesion layer formed on the outermost surface of the first substrate with a second substrate. In this manner, the first interconnection and the second interconnection can be buried between the first and the second substrates.

Because a third interconnection is formed on a back of the first substrate subjected to polishing and removal for planarization, a planarized third interconnection can be implemented.

Furthermore, the first interconnection comprises a gate electrode. Thus, a gate electrode and a contact can be formed on either the back of the first substrate or the surface of the second substrate.

DETAILED DESCRIPTION OF THE INVENTION

The present invention is described in further detail below referring to examples and to the attached drawings.

FIGS. 1A to 1E are a diagram showing the structures obtained in process steps according to an embodiment of the present invention, which comprises fabricating an element comprising a transistor on a substrate. FIG. 2 shows a cross-sectional view of a multilevel interconnection fabricated by a process according to an embodiment of the present invention.

Figure 1A:
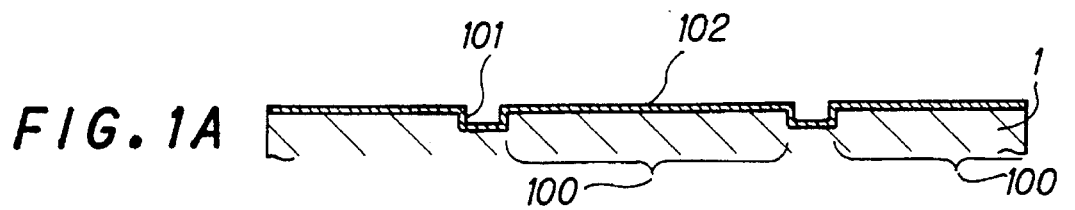
FIGS. 1A to 1E are a diagram showing the structures obtained in the process steps according to an embodiment of the present invention.
Figure 2:
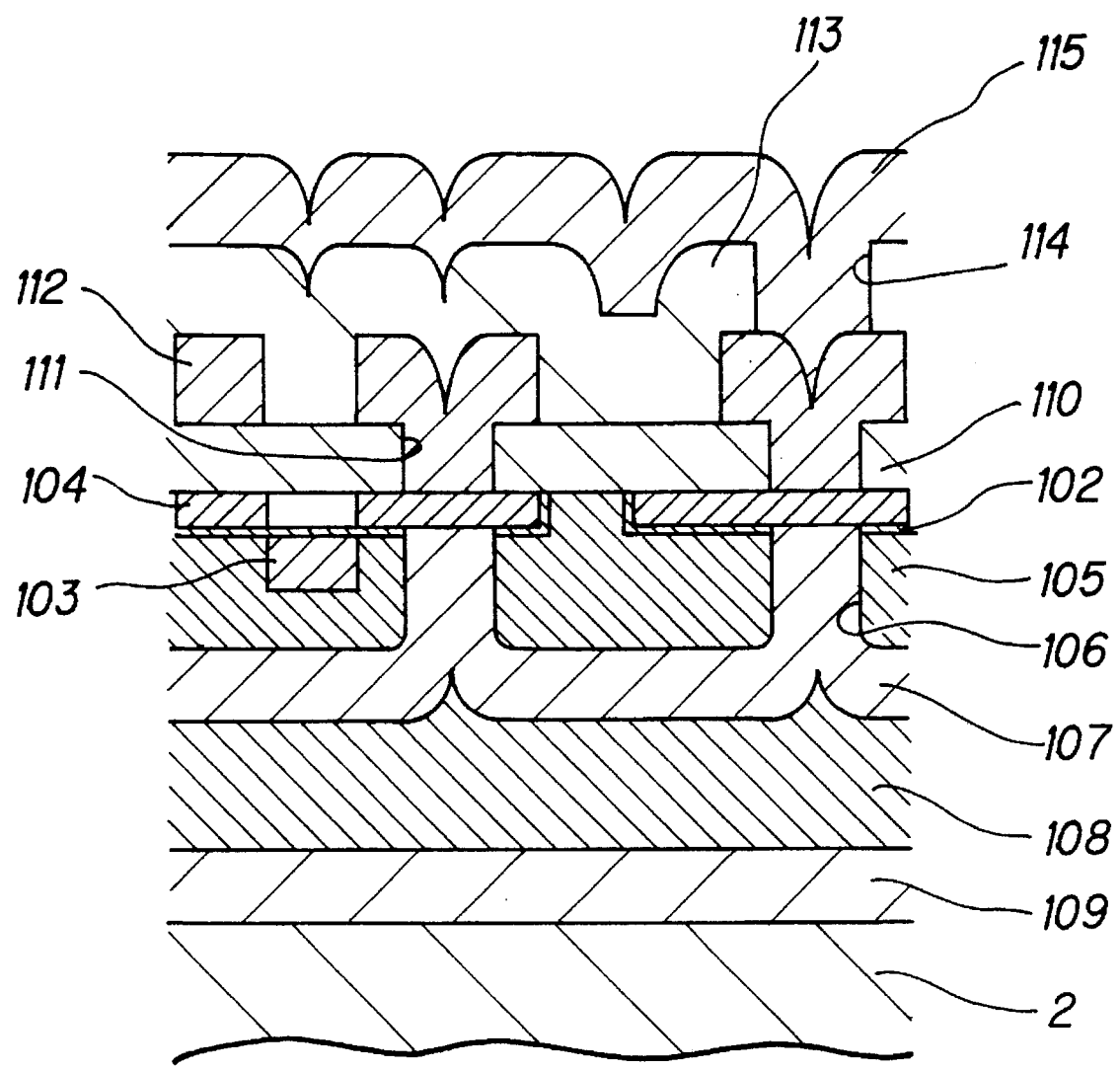
FIG. 2 is a cross-sectional view of a multilevel interconnection according to an embodiment of the present invention.

Referring to FIG. 1A, a trench 101 which surrounds a region 100 for a transistor is formed on a first substrate 1 by means of lithography and etching. The first substrate 1 is made of, for example, silicon. The etching process above can be effected by, for instance, reactive ion etching (referred to simply hereinafter as "RIE").

After forming the trench 101, a gate oxide film 102 is formed as a first insulating film on the surface of the first substrate 1 inclusive of the trench 101. The gate oxide film 102 comprises, for example, silicon oxide, and can be formed by, for instance, thermal oxidation.

Figure 1B:
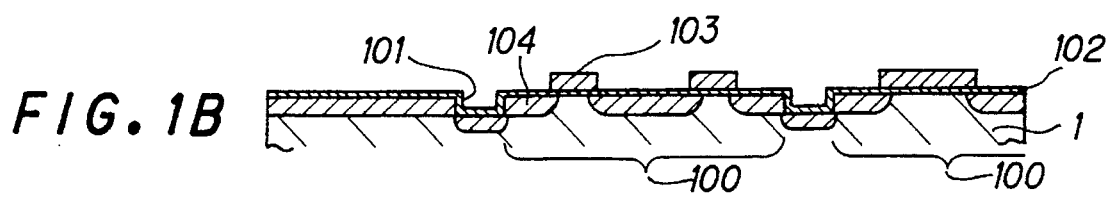

Referring to FIG. 1B, the step according to a process of the present invention comprises forming an electrically conductive film (not shown in the figure) on the surface of the gate oxide film 102. The electrically conductive film may be made from polysilicon by employing, for example, chemical vapor deposition (referred to simply hereinafter as "CVD").

The resulting electrically conductive film is patterned thereafter by means of lithography and etching. In this manner, a gate electrode 103 is formed on the gate oxide film 102 provided on the region 100 for forming the transistor. This gate electrode 103 provides the first interconnection.

Source/drain 104 is formed on the first substrate by effecting ion implantation using the gate electrode 103 as a mask.

Figure 1C:
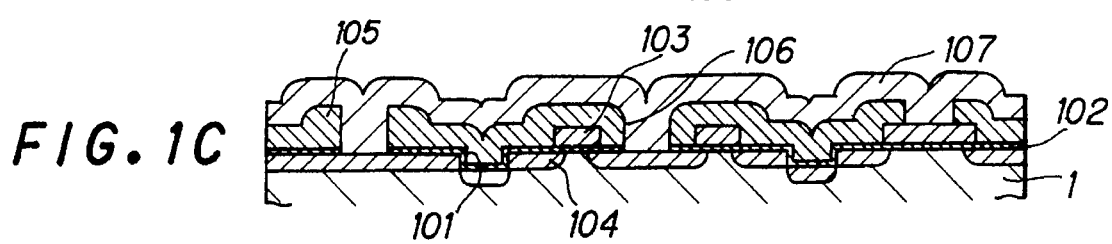

Referring to FIG. 1C, a second insulating film 105 is formed on the surface of the first substrate. At this time, the second insulating film 105 is formed in such a manner that the gate electrode 103 is covered and the trench 101 is filled thereby. The second insulating film 105 is made of, for example, silicon oxide, and is formed by, for example, a CVD process. The second insulating film 105 also functions as an element isolation film.

A resist film (not shown in the figure) is then formed on the second insulating film 105 and patterned by means of etching and lithography to form an opening in the resist film. Subsequently, a contact hole 106 is formed in the second insulating film by means of, for example, RIE employing the resist film as a mask. The remaining resist film is removed thereafter, for instance, by utilizing plasma asher or by a wet process.

Then, an electrically conductive film (not shown in the figure) is formed on the second insulating film 105 in such a manner to fill the contact hole 106. The electrically conductive film can be formed from, for example, polysilicon or a refractory metal silicide, by means of, for instance, sputtering, CVD, or vacuum deposition.

The resulting electrically conductive film is patterned by lithography and etching thereafter to obtain a second interconnection 107.

Figure 1D:
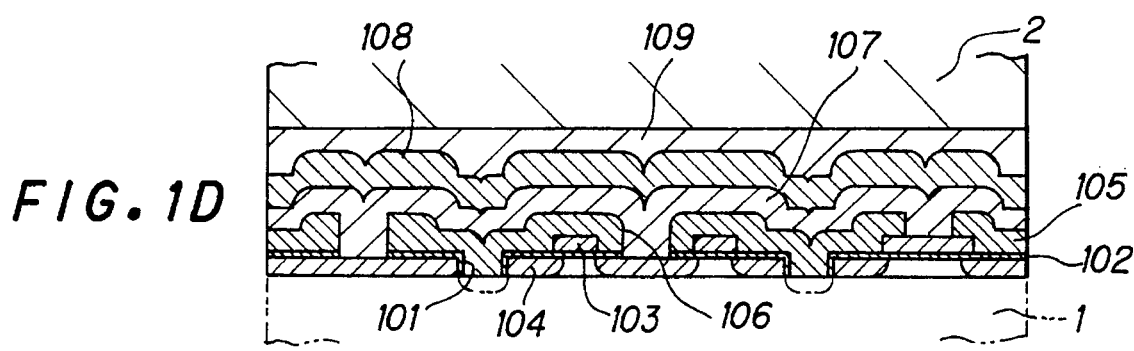

In the step shown in FIG. 1D, a third insulating film 108 and an adhesion layer 109 are formed sequentially in this order on the second insulating film in such a manner that the second interconnection may be covered thereby.

For instance, a silicon oxide film can be formed as a third insulating film 108 by CVD on the second insulating film 105 to cover the second interconnection 107.

After forming the third insulating film 108, a polysilicon film is deposited on the third insulating film 108 by means of a process such as CVD, and the surface of the resulting film is planarized by using a chemical and/or a mechanical polishing process. Thus is obtained the adhesion layer 109.

The surface of the resulting adhesion layer 109 and the surface of the second substrate 2, which functions as a supporting substrate in this example, are bonded. The bond can be formed by employing a well known technology, i.e., a so-called SOI (Silicon On Insulator) technology. More specifically, the surface of the adhesion layer 109 is brought into close contact with the surface of the second substrate 2, and both are subjected to a heat treatment at a predetermined temperature for a predetermined duration of time.

The first substrate 1 is removed thereafter from the back of the first substrate 1 until the bottom of the trench 101 is reached. The first substrate can be removed by, for instance, a chemical and mechanical polishing process. Thus is obtained a planarized surface on the back of the first substrate after this removal process.

Figure 1E:
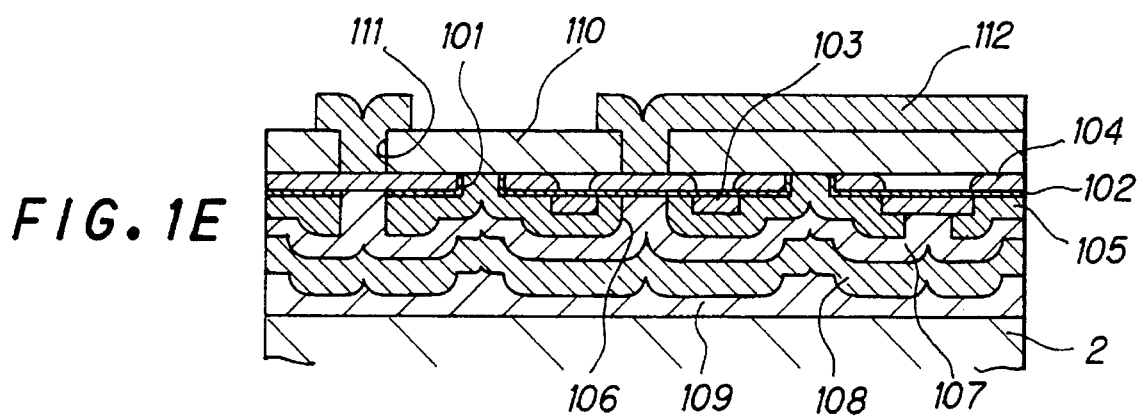

In the step referring to FIG. 1E, a fourth insulating film 110 is formed on the back of the planarized substrate 1. FIG. 1E illustrates the structure obtained after step 5, but is shown upside down as compared with those illustrated in FIGS. 1A to 1D.

The fourth insulating film 110 above can be obtained, for instance, by depositing silicon oxide employing a CVD process.

Subsequently, a resist film (not shown in the figure) is formed on the fourth insulating film 110, and is patterned by means of etching and lithography to form an opening in the resist. Then, RIE, for instance, is effected using the resist film as a mask to provide, for example, a contact hole 111 on the source/drain 104 of the transistor and on the fourth insulating film 110 at the position from which the second interconnection is to be drawn out. The remaining resist film is removed by means of, for instance, plasma asher or wet process.

Then, an electrically conductive film (not shown in the figure) is formed on the fourth insulating film 110 in such a manner to fill the contact hole 111. The electrically conductive film can be formed from, for example, aluminum or an aluminum alloy, by means of, for instance, sputtering, CVD, or vacuum deposition.

The resulting electrically conductive film is patterned by lithography and etching thereafter to obtain a third interconnection 112.

Referring to FIG. 2, a fifth insulating film 113 is formed on the fourth insulating film 110 in a manner similar to that employed for forming the fourth insulating film 110. Thus, a fifth insulating film 113 is formed on the fourth insulating film 110 to cover the third interconnection 112.

A contact hole 114 is formed on a fifth insulating film 113 in a manner similar to that used for forming the contact hole 111.

Similarly, a fourth interconnection 115 is formed on the fifth insulating film 113 according to a process similar to that used for forming the third interconnection 112.

Thus is obtained, for instance, a four-layered multilevel interconnection as shown in FIG. 2.

In the example described above, the adhesion layer 109 formed on the outermost surface of the first substrate 1 in the fourth step is bonded with a second substrate 2 to implement a bonded SOI structure. Thus, the first interconnection, i.e., the gate electrode 103, and the second interconnection 107 are found buried between the first substrate 1 and the second substrate 2.

Figure 7:
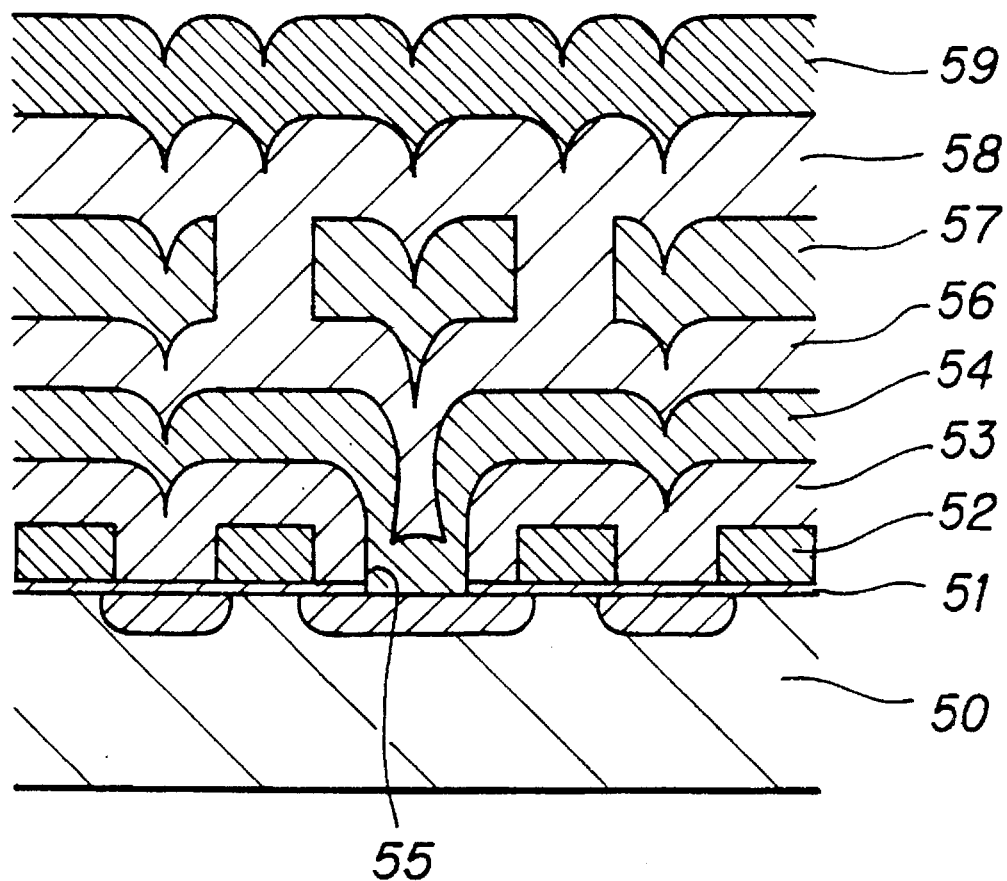
FIG. 7 is a cross-sectional view of a multilevel interconnection fabricated according to a related art process.

More specifically, as compared with a related art for a 4-layered multilevel interconnection (see FIG. 7), the process described above provides a structure in which the step is eliminated for the gate electrode 103 and the second interconnection 107, and for the gate oxide film 102 and the second insulating film 105. Moreover, the third interconnection 112 and the fourth interconnection 115 are formed on the planarized back of the first substrate 1 subjected to polishing and removal. Accordingly, as shown in FIG. 2, a planar third interconnection 112 can be implemented. Furthermore, the fourth interconnection 115 can be formed with a low step height.

Because an SOI structure is implemented by laminating a first substrate 1 and a second substrate 2, the gate electrode 103 can be contacted from either the back side of the first substrate 1 or the surface side of the second substrate 2.

It can be seen that the process described above realizes a multilevel interconnection comprising upper layer interconnections having lower step heights as compared with a conventional one having the same number of layers. Thus, the upper interconnections can be readily processed. Furthermore, the number of defective products due to contact failures among interconnections or to short circuit and/or open circuit failures can be considerably reduced. Hence, the formation of such multilevel interconnections with high reliability increases the product yield.

In case of applying the multilevel interconnection above to a cell base LSI, the contact position of the gate array can be selected with a greater degree of freedom. This is effective for the implementation of a highly integrated LSI.

The process according to the present invention is particularly effective for a cell base LSI. However, the process is also applicable to embedded cell arrays; that is, to ASICs on which cell base gate arrays are mounted.

A practical example to which the process according to the present invention is applied is described below.

Figure 3:
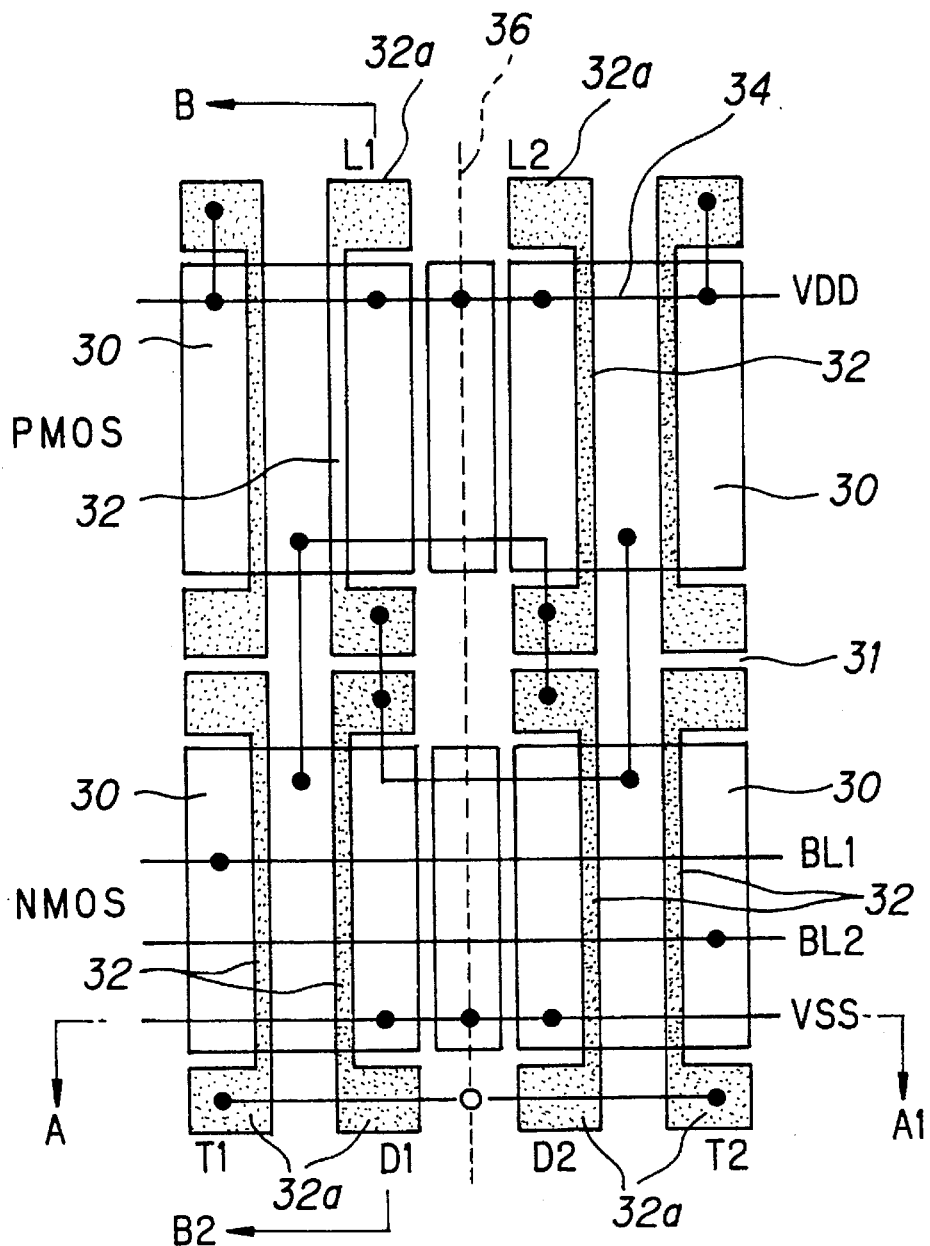
FIG. 3 is a layout of an SRAM utilizing a cell base gate array fabricated according to an embodiment of the present invention.
Figure 4:
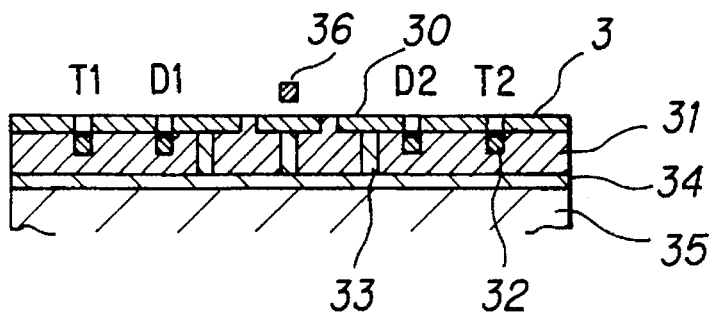
FIG. 4 is a cross-sectional view taken in the line A-A1 of FIG. 3.
Figure 5:
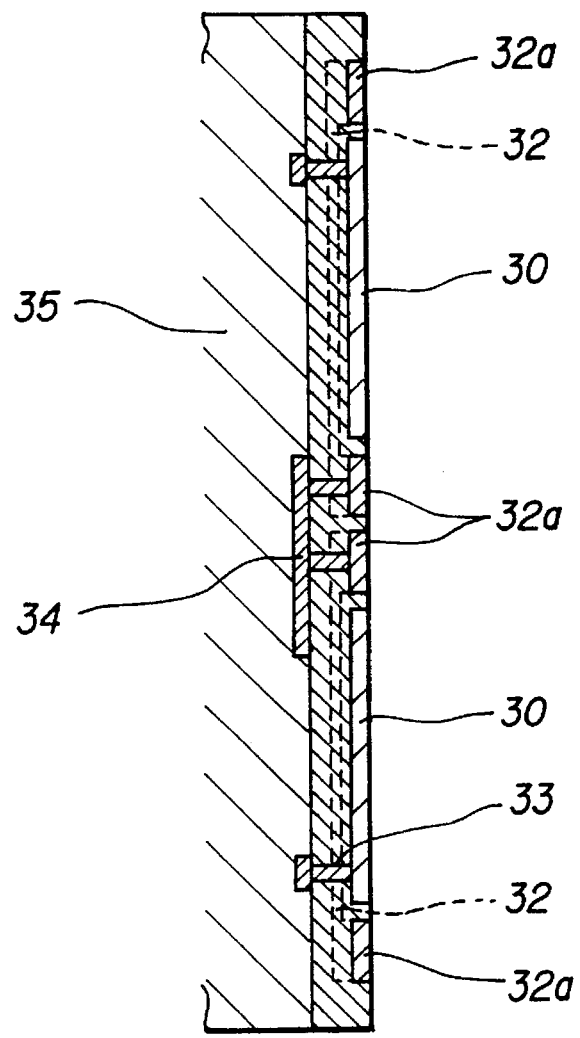
FIG. 5 is a cross-sectional view taken in the line B-B2 of FIG. 3.
Figure 6:
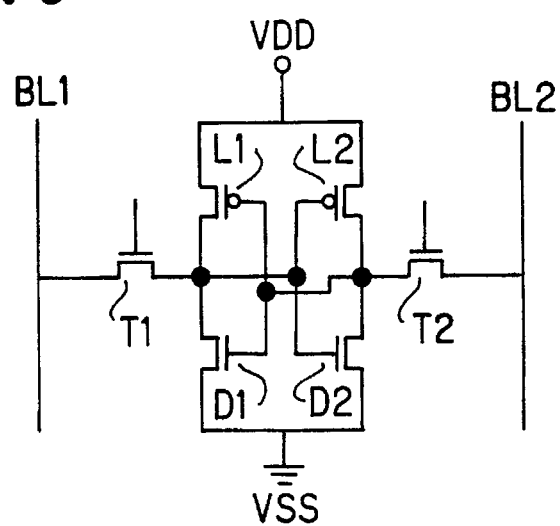
FIG. 6 is a diagram showing an equivalent circuit for the SRAM shown in FIG. 3.

FIG. 3 shows a layout of a static RAM (referred to simply hereinafter as an "SRAM") in which a cell base gate array fabricated by a process according to the present invention is a employed. FIG. 4 is cross-sectional view of the structure taken in the line A-A1 of FIG. 3. FIG. 5 is a cross sectional view of the structure taken in the line B-B2 of FIG. 3. FIG. 6 shows an equivalent circuit for the SRAM illustrated in FIG. 3.

Referring to the figures above, the SRAM comprises six transistors in total; i.e., two data hold transistors (referred to hereinafter as Di and D2), two load transistors (referred to hereinafter as L1 and L2), and two select transistors (referred to hereinafter as T1 and T2). Of the six transistors identified above, D1, D2, T1, and T2 are each an NMOS transistor, whereas L1 and L2 are each a PMOS transistor.

Referring to FIGS. 4 and 5, each of the gate electrodes 32 for the transistors D1, D2, L1, L2, T1, and T2 is formed in the manner similar to that described above. Thus, the gate electrode 32 is buried in the second insulating film 31. Moreover, if the gate electrode 32 is taken as the first interconnection, the second interconnection 34 is formed on the lower side of the second insulating film 31, and is buried between the second insulating film 31 and the third insulating film 35.

More specifically, the diffusion layer 30 of the source/drain for each of the transistors D1, D2, L1, L2, T1, and T2, as well as the electrode pad 32a for each of the gate electrodes are formed in the inside of the first substrate 3 and on the surface side thereof.

In a planar view referring to FIG. 3, for example, with respect to the diffusion layers 30 for the transistors L1 and L2, the diffusion layers 30 for the transistors T1 and D1 are disposed opposed to each other. Similarly, the diffusion layers 30 for the transistors D2 and T2 are disposed opposed to each other. Among the diffusion layers 30 enumerated above, those for the transistors T1 and D1 are formed in such a manner that the common portion can be shared with each other. Similarly, the diffusion layers 30 for the transistors D2 and T2 are formed in such a manner that the common portion can be shared with each other.

The first substrate 3 can be made from, for example, silicon, and the electrode pad 32a can be made from, for example, polysilicon.

A second insulating film 31 is formed on the lower side of the diffusion layer 30 with a first insulating film (not shown in the figure) interposed therebetween. A gate electrode 32 is formed inside the second insulating film 31, and it is connected to the electrode pad 32a. The gate electrode 32 can be made from, for example, polysilicon.

A second interconnection 34 is formed on the lower side of the second insulating film 31. In FIG. 3, the second interconnection 34 is indicated with solid lines.

The second interconnection 34 is connected to the diffusion layer 30 or the electrode pad 32a through a contact hole 33 provided to the second insulating film 31. Referring to FIG. 3, a contact between the second interconnection 34 and the diffusion layer 30 or the electrode pad 32a is shown with a filled circle.

That is, a contact between a second interconnection 34 and a diffusion layer 30 or an electrode pad 32a is buried in a second insulating film 31.

A third insulating film 35 is formed on the lower side of the second interconnection 34. In FIGS. 4 and 5, the adhesion layer and the second substrate, to be formed on the lower side of the third insulating film, is omitted.

Conclusively, it can be seen that a second interconnection 34 is formed in such a manner that it is buried between a second insulating film 31 and a third insulating film 35.

A third interconnection 36 is formed on the upper side of the first substrate 3 with a fourth insulating film (not shown in the figure) interposed therebetween. The broken lines shown in FIG. 3 indicate the third interconnection 36, and an open circle indicates the position of a contact hole between a third interconnection 36 and a first interconnection 32.

In the present example, each of the transistors D1, D2, L1, L2, T1, and T2 are connected with two bit lines (referred to hereinafter as "Bi" and "B2"), a power line (referred to hereinafter as "VDD"), and an earth line (referred to hereinafter as "VSS") by employing a second interconnection 34 in the manner described below.

The second interconnection 34 connects the bit line B1 with the diffusion layer 30 of the transistor T1, and the common diffusion layer 30 of the transistors T1 and D1 with the diffusion layer 30 of the transistor L1. It also connects the diffusion layer 30 of the transistor L1 with the electrode pad 32a of the gate electrode 32 of the transistor L2, and the electrode pad 32a with the electrode pad 32a of the transistor D2.

It furthermore connects the diffusion layer 30 of the transistor L1 and the diffusion layer 30 of the transistor L2 with the power line VDD, and the diffusion layer 30 of the transistor L2 with the common diffusion layer 30 for the transistors T2 and D2. Then, the common layer 30 for the transistors T2 and D2 is connected with the electrode pad 32a, and this electrode pad 32a is connected with the electrode pad 32a of the transistor L1. The diffusion layer 30 of the transistor T2 is connected with the bit line B2, and the diffusion layer 30 of the transistor D1 and the diffusion layer 30 of the transistor D2 are connected with the earth line VSS.

In the example above, the gate electrode 32 and the electrode pad 32a of each of the transistors D1, D2, L1, L2, T1, and T2, constituting the SRAM as well as the second interconnection 34, are provided so that they may be buried between the first substrate 3 and the third insulating film 35.

Conclusively, the process according to the present invention enables a device comprising an SRAM buried between a first substrate 3 and a second substrate bonded to the first substrate 3.

As described above, the present invention provides a process which comprises bonding an adhesion layer formed on the outermost surface of a first substrate with a second substrate. Accordingly, the process according to the present invention realizes a structure comprising a first interconnection and a second interconnection, between a first substrate and a second substrate. Furthermore, since a third interconnection is formed on the polished and removed planar back of a first substrate, a planarized third interconnection can be implemented.

Accordingly, the present invention enables a multi-level interconnection having smaller steps for the upper layer interconnections as compared with those obtained by a related art process. Hence, the processing of the interconnections in the upper layers is facilitated, and the defective devices due to contact failure among the interconnections or short circuit failure and/or open circuit failure can be minimized. The product yield can be improved, because highly reliable multilevel interconnections can be formed.

Moreover, by providing the first interconnection as a gate electrode, contact can be made from either the back side of the first substrate or the surface side thereof.

Because the degree of positional freedom is increased for the contact of the gate electrode, the present invention is particularly effective for increasing integration of LSIs.

While the invention has been described in detail and with reference to specific embodiments thereof, it will be apparent to one skilled in the art that various changes and modifications can be made therein without departing from the spirit and scope thereof.

What is claimed is:

1. A process for fabricating a semiconductor device having a multilevel interconnection, comprising:

forming a trench on the surface of a first substrate to provide an element isolating region;

forming a first insulating film on the surface of the trench and the first substrate;

forming a first interconnection layer on the surface of the first insulating film;

forming a second insulating film on the surface of the first substrate in such a manner that the first interconnection layer is covered and the trench is filled;

forming a second interconnection layer on the second insulating film;

forming sequentially in this order, a third insulating film and an adhesion layer on the surface of said second insulating film covering the second interconnection layer;

bonding a second substrate on the surface of the adhesion layer;

planarizing the back of the first substrate by removing the first substrate from the back side thereof and the bottom of the trench; and forming a fourth insulating film on the back of the first substrate, and forming a third interconnection layer on the fourth insulating film.

2. A process for fabricating a semiconductor device as claimed in claim 1, wherein the step of forming a first insulating film comprises forming a gate insulating film, and the step of forming a first interconnection layer comprises forming a gate electrode by patterning a conductive film.

3. A process for fabricating a semiconductor device as claimed in claim 2, wherein the process further comprises forming a source/drain region on the first substrate after forming the gate electrode.

4. A process for fabricating a semiconductor device as claimed in claim 1, wherein the step of forming a second insulating film further comprises forming a second insulating film on the entire surface of the first substrate and patterning the resulting second insulating film.

5. A process for fabricating a semiconductor device as claimed in claim 1, wherein the process for forming the adhesion layer comprises planarizing the surface by forming a polysilicon layer on the third insulating film and polishing the surface of the resulting polysilicon layer.

6. A process for fabricating a semiconductor device as claimed in claim 1, wherein the step of forming a fourth insulating film comprises forming a fourth insulating film over the back of the first substrate and patterning the resulting fourth insulating film.

* * * * *